United States Patent
Zandt In't et al.

(10) Patent No.: US 6,521,498 B2
(45) Date of Patent: Feb. 18, 2003

(54) MANUFACTURE OR TRENCH-GATE SEMICONDUCTOR DEVICES

(75) Inventors: Michael A. A. Zandt In't, Veldhoven (NL); Erwin A. Hijzen, Blanden (NL); Raymond J. E. Heuting, Helmond (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/055,350

(22) Filed: Jun. 4, 2002

(65) Prior Publication Data

US 2002/0137291 A1 Sep. 26, 2002

(30) Foreign Application Priority Data

Jan. 23, 2001 (GB) .............................................. 0101695

(51) Int. Cl.[7] .............................................. H01L 21/336
(52) U.S. Cl. ...................................... 438/270; 438/589
(58) Field of Search ................................ 438/138, 268, 438/270, 271, 589, 595

(56) References Cited

U.S. PATENT DOCUMENTS

| | | | | |
|---|---|---|---|---|
| 5,378,655 A | | 1/1995 | Hutchings et al. | 437/203 |
| 5,726,088 A | * | 3/1998 | Yanagiya et al. | 438/270 |
| 5,918,114 A | * | 6/1999 | Choi et al. | 438/270 |
| 5,972,741 A | * | 10/1999 | Kubo et al. | 438/268 |
| 6,096,608 A | * | 8/2000 | Williams | 438/589 |

* cited by examiner

Primary Examiner—Chandra Chaudhari
(74) Attorney, Agent, or Firm—Steven R. Biren

(57) ABSTRACT

The manufacture of a vertical power transistor trench-gate semiconductor device in which the source regions (13) are self-aligned to the trench-gate structures (20,17,11) including the steps of forming a mask (61) on a surface (10a) of a semiconductor body (10), using the mask (61) to form the trench-gate structures (20,17,11), then using the mask (61) to form U-shaped section layers (62A, 62B) of insulating material whose base portion (62B) provides a gate insulating layer on the gate material (11), then removing the mask (61) and forming spacers (64) against well-defined steps provided by the upright portions (62A) of the U-shaped section layers, then using the spacers (64) to form the source regions (13).

15 Claims, 5 Drawing Sheets

MANUFACTURE OR TRENCH-GATE SEMICONDUCTOR DEVICES

BACKGROUND OF THE INVENTION

This invention relates to a method of manufacturing a vertical power transistor trench-gate semiconductor device of the type having a plurality of transistor cells, each transistor cell being surrounded by a trench-gate structure comprising a trench extending into a semiconductor body with gate material in the trench and a gate insulating layer between the trench and the gate material, and each transistor cell having an annular source region adjacent an upper part of the trench-gate structure and separated from a drain region by a channel-accommodating body region adjacent the trench-gate structure. The invention also relates to semiconductor devices of this type manufactured by such a method.

DESCRIPTION OF THE RELATED ART

In a method of manufacturing a device of the above-defined type which is known from United States patent U.S. Pat. No. 5,378,655, the method includes forming the source regions so as to be self-aligned to the trench-gate structures. This self-alignment is achieved by the disclosed and taught method summarised as follows. A trench is etched through a window in a mask on a semiconductor body. After removing the mask, gate material is provided in the trench and then an upper portion of the gate material is oxidised to form a trench-gate structure which has an insulating cap on the gate. The insulating cap is then caused to form a step which protrudes from the adjacent semiconductor surface. A layer is then provided over the surface structure and then etched to leave a side wall spacer in the trench-gate step. The spacer is then used to define the source region which is thus formed to be self-aligned to the trench-gate structure.

By using such techniques as disclosed in U.S. Pat. No. 5,378,655, the number of photolithographic masking steps which require separate alignment can be reduced and compact cellular device structures can be formed.

SUMMARY OF THE INVENTION

An object of the present invention is to provide an alternative and advantageous method of forming the source regions self-aligned to the trench-gate structures.

According to the present invention there is provided a method as defined in claim 1. The method is characterised by the steps of:

(a) forming on a surface of the semiconductor body a first mask of a first material with first windows, each said first window having a mid-point path coincident with a mid-point path of the location of a said trench;

(b) providing in each first window a U-shaped section layer of an insulating second material, the layers of second material being provided after the trench-gate structures are formed, each layer of second material having upright portions on the side walls of the first window and a base portion which provides a gate insulating overlayer on the gate material of a said trench-gate structure;

(c) removing the first mask and then forming spacers, each spacer having a vertical surface which is aligned with the location of a surface of a said upright portion of the layer of second material and each spacer having a horizontal base surface;

(d) using the spacers to form the annular source regions with the lateral extent of the source regions from the trench-gate structures being determined by the lateral extent of the base surface of the spacers; and (e) providing a source electrode to contact the source regions and the body regions adjacent the source regions.

In the method of the present invention, the upright portions of the U-shaped section layers provide well-defined steps for the spacers used to form the source regions. Also, providing a gate insulating overlayer on the gate material by means of the base portion of the U-shaped section layers is preferable to providing this overlayer by oxidising the gate material, which can involve so-called bird's beak problems. Preferred features of the present invention are indicated as follows.

The trenches may be etched using a mask of said first material as defined in claim 2 or claim 3. These mask windows may then be widened so that the gate insulating layers have horizontal extensions on the semiconductor body surface which remain when the first mask is removed as defined in claim 3, these horizontal extensions advantageously protecting the gate insulation near the top of the trenches during this removal of the first mask.

As defined in claim 5, a mask of the first material may first have preceding U-shaped section layers provided in its windows with a central part of the base portion of these layers being removed to provide etch windows for the trenches after which the remainder of the preceding layers is removed, the mask of the first material then being used for providing the U-shaped section layers which define steps for the spacers used to form the source regions. In this way, starting from one mask, a two-stage self-aligned process may provide well-defined narrow trenches and then well-defined source regions.

As defined in claims 2, 4 or 7, each spacer vertical surface may be aligned with an outer surface of one of the upright portions of the second material. The spacers may be formed with a third material present in the U-shaped section layers as defined in claim 8. Otherwise, the third material may be removed before forming the spacers of an insulating material such that further spacers are also formed against the inner surfaces of the upright portions and merge to cover the base portions of the U-shaped section layers as defined in claim 9. Such merged spacers forming a further insulating layer on top of the gate insulating U-cup base advantageously reduces gate-source capacitance. In cases where the spacers are formed against the U-shaped section second layer uprights, the first mask may be silicon dioxide and the second layer may be silicon nitride as defined in claim 10; in this case the high etch selectivity of the oxide with respect to the nitride advantageously assists good definition of the nitride uprights when the oxide mask is removed.

As an alternative to forming the spacers against the U-shaped section second layer uprights, the U-shaped section layers may be filled with a third material and the upright portions may be removed when the first mask is removed so that the spacers are formed against the third material as defined in claim 11; in this case the first mask material and the second layer material may both be silicon dioxide.

The source regions may be formed by etching upper regions of the semiconductor body of a suitable conductivity type using the spacers as a mask as defined in claim 13. The spacers may then be etched as defined in claim 14 to advantageously expose top surfaces as well as side surfaces of the source regions for improved contact by the source electrode. Preferably the upper regions which are to be etched to form the source regions are formed by dopant implantation and diffusion after removing the first mask as defined in claim 15. Forming these upper regions at this late stage in the process is advantageous for thermal budget reasons.

BRIEF DESCRIPTION OF THE DRAWINGS

Embodiments of the present invention will now be described, by way of example, with reference to the accompanying diagrammatic drawings, in which.

Figure 1A:
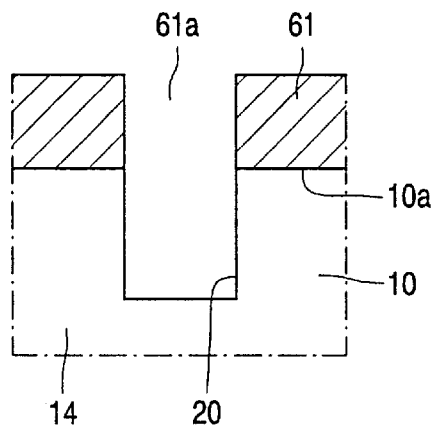
FIGS. 1A to 1F are a cross-sectional view of part of a semiconductor body at successive stages in the manufacture of a vertical trench-gate power transistor by an example of a method in accordance with the present invention, these Figures showing the manufacture of a trench-gate structure and part of a transistor cell on either side of the trench-gate structure.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

DETAILED DESCRIPTION OF THE PREFERRED EMBODIMENTS

Figure 2:
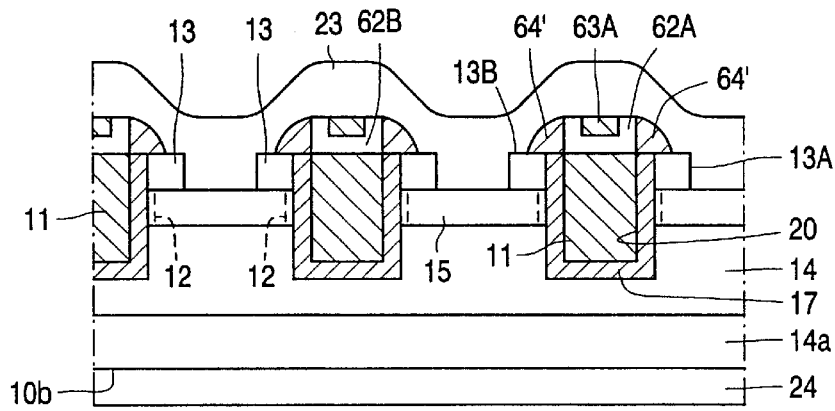
FIG. 2 is a cross-sectional view of the semiconductor body of FIG. 1F, showing two transistor cells with surrounding trench-gate structures and showing source and drain electrodes.

FIG. 2 illustrates an exemplary embodiment of a vertical trench-gate power transistor having a plurality of transistor cells, each transistor cell being surrounded by a trench-gate structure comprising gate material 11 in a trench 20 and a gate insulating layer 17, and each transistor cell having source and drain regions 13 and 14, respectively, of a first conductivity type (n-type in this example) which are separated by a channel-accommodating body region 15 of the opposite second conductivity type (i.e. p-type in this example) adjacent to the trench-gate structure. The application of a voltage signal to the gates 11 in the on-state of the device serves in known manner for inducing a conduction channel 12 in the regions 15 and for controlling current flow in each conduction channel 12 between the source and drain regions 13 and 14.

The source regions 13 and adjacent body regions 15 are contacted by a source electrode 23 at the top of the device body. The region 14 may be a drain-drift region formed by an epitaxial layer of high resistivity (low doping) on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 24, called the drain electrode in the case of a MOSFET and called the anode electrode in the case of an IGBT.

A vertical trench-gate power transistor, with transistor cells which may be of square, hexagonal or elongate stripe shape geometry, typically comprises many hundreds of parallel transistor cells between the source electrode 23 and the drain electrode 24. The active cellular area of the device may be bounded around the periphery of the semiconductor body 10 by various known peripheral termination schemes.

Figure 1B:
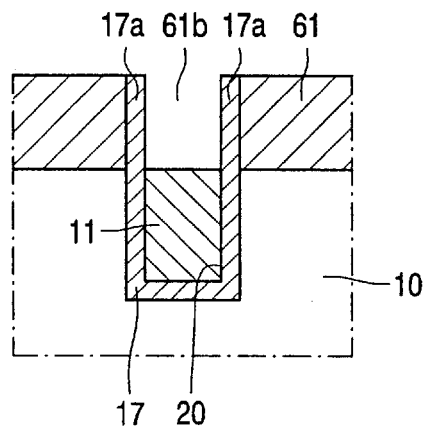
Figure 1C:
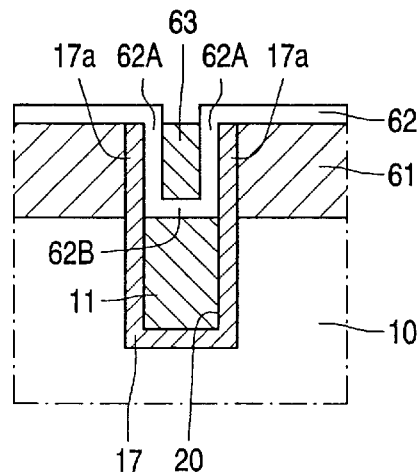
Figure 1D:
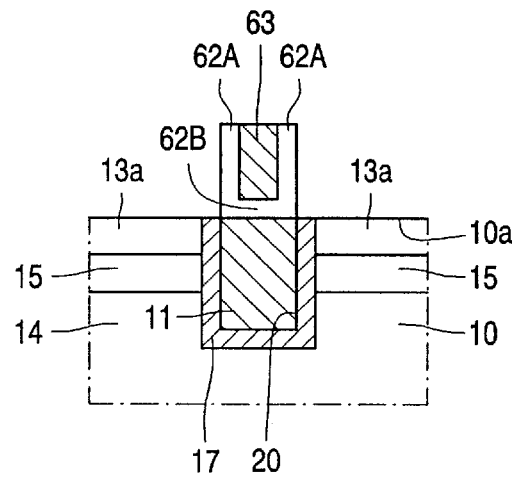
Figure 1E:
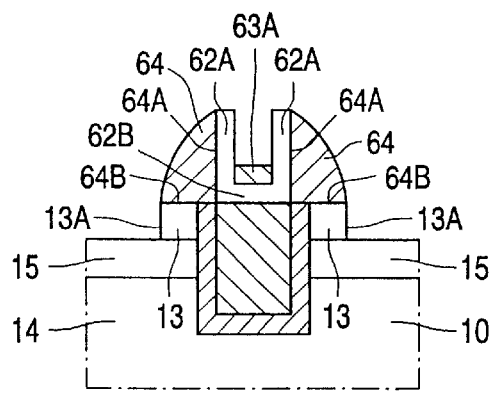

The device of FIG. 2 is manufactured by a method which, in overview of FIGS. 1A to 1E includes the steps of:

forming on a surface 10a of a semiconductor body 10 (typically of monocrystalline silicon) a mask 61 of a first material (preferably silicon dioxide) with etch windows 61a which are used to etch trenches 20, see FIG. 1A;

forming trench-gate structures each comprising a trench 20 with gate material 11 in the trench 20 and a gate insulating layer 17 (preferably silicon dioxide), the layer 17 having an upward extension 17a which forms a narrowed window 61b in the mask 61, see FIG. 1B;

providing in each window 61b a U-shaped section layer of an insulating second material (preferably silicon nitride) having upright portions 62A on the side walls of the window 61b and a base portion 62B which provides a gate insulating overlayer, and filling the U-shaped section layer with a third material 63 (typically polycrystalline silicon), see FIG. 1C;

removing the mask 61 and the upward insulating layer extensions 17a, and then forming p-type regions 15 suitable for body regions and n-type regions 13a suitable for source regions by dopant implantation and diffusion, see FIG. 1D; and then forming spacers 64 (typically of silicon dioxide), each spacer being aligned with an outer surface of an upright portion 62A of a U-shaped section layer, and then using the spacers 64 as a mask to etch the regions 13a to form exposed annular source regions 13 and to expose the body regions 15, see FIG. 1E.

Summarising the above-described steps, a single mask 61 is used for forming trench-gate structures 20, 17, 11 followed by a process in which source regions 13 and adjacent channel-accommodating body regions 15 are formed self-aligned to the trench-gate structures. The self-aligned process uses U-shaped section layers whose upright portions 62A provide well-defined steps for spacers 64 used to form the source regions 13 and whose base portions 62B provide insulating overlayers on the gates 11. This process is suitable for cellular trench-gate power transistors in which the transistor cell pitch is relatively small, that is to say less than 3 μm and typically 2 μm.

Successive stages in the manufacture of the transistor cells of FIG. 2 will now be described in detail with reference to FIGS. 1A to 1F.

FIG. 1A shows a monocrystalline silicon semiconductor body 10 having an upper surface 10a. A mask 61 of a first material, in this example silicon dioxide, is formed at the surface 10a by forming a continuous thick layer using known deposition techniques, for example plasma enhanced chemical vapour deposition, and then forming etch windows 61a in this layer using known photolithography and etching techniques. In a typical example, the layer 61 has a thickness of 0.5 μm and each window 61a has a width of 0.6 μm. A trench 20 is then formed by etching into the semiconductor body 10 at each window 61a, preferably using an anisotropic plasma etch.

As illustrated by FIG. 1B, a thin gate insulating layer 17, in this example silicon dioxide, is then formed in each trench 20 with an upward extension 17a which forms a narrowed window 61b in the mask 61. The narrowed windows 61b form first windows in a first mask of the first material, silicon dioxide, each window 61b having a mid-point path coincident with a mid-point path of the location of a trench 20. The layer 17, 17a may be formed by deposition, or by dry oxidation of the silicon body 10, or by oxidation by wet oxide growth. Gate material 11, which may be doped polycrystalline silicon, is then deposited in the trench 20 on the insulating layer 17, 17a and then etched back level with the semiconductor body surface 10a. Each trench 20 together with the gate insulating layer 17 and the gate material 11 forms a trench-gate structure to surround a transistor cell.

As illustrated in FIG. 1C, a continuous thin layer 62 of an insulating second material, in this example silicon nitride, is formed by deposition on top of the mask 61 and in each window 61b. The layer 62 is conformal to the shape of the windows 61b and provides in each window 61b a U-shaped section layer of silicon nitride having upright portions 62A on the side walls of the window 61b and a base portion 62B which provides a gate insulating overlayer on the gate material 11 of a trench-gate structure. In the typical example, the layer 62 has a thickness of 0.05 μm. A third material 63, in this example polycrystalline silicon, is deposited and is then etched back anisotropically, to the level of the silicon nitride layer 62 at the top of the mask 61, and fills the U-shaped section layer 62A, 62B. The silicon nitride layer 62 is then etched away from the top of the first mask 61, 17a of silicon dioxide, and then the first mask 61, 17a is removed by etching to leave the U-shaped section layers 62A, 62B filled by the material 63 masking the otherwise exposed upper surface 10a of the semiconductor body 10 as shown in FIG. 1D.

As further illustrated in FIG. 1D, two stages of dopant ion implantation followed by annealing and diffusion into the semiconductor body 10 are performed. In the first stage p-type regions 15 are formed to a suitable depth adjacent the trench-gate structures 20, 17, 11 suitable for the channel-accommodating body regions of the transistor cells, a suitable acceptor dopant being boron. In the second stage regions 13a of n+ conductivity type suitable for the annular source regions of the transistor cells are formed in an upper part of the semiconductor body 10, a suitable donor dopant being phosphorous or arsenic. The regions 13a are surrounded by the U-shaped section layers 62A, 62B of silicon nitride. A thin layer of silicon dioxide (not shown) may be grown on the semiconductor body surface 10a before the implantation stages, and then removed at a later stage.

A layer of silicon dioxide is then deposited and has a contoured upper surface (not shown) above the polycrystalline silicon filler 63, the silicon nitride upright portions 62A and the semiconductor body upper surface 10a. This contoured silicon dioxide layer is then anisotropically etched to form spacers 64 as shown in FIG. 1E. Each silicon dioxide spacer 64 has a vertical surface 64A aligned with an outer surface of an upright portion 62A of silicon nitride, a horizontal base surface 64B and a curved sidewall between the vertical and horizontal surfaces 64A and 64B.

As further illustrated in FIG. 1E, annular source regions 13 are then formed by etching the n+ regions 13a using the spacers 64 as a mask, the lateral extent of the source regions 13 from the trench-gate structures 20, 17, 11 being determined by the lateral extent of the base surface 64B of the spacers 64. Etching to form the source regions 13 exposes the vertical side surfaces 13A of these source regions 13 and the adjacent upper surfaces of the body regions 15. This etching stage also partly etches the polycrystalline filler 63 to form a reduced height filler 63A within each U-shaped section silicon nitride layer 62A, 62B.

Figure 1F:
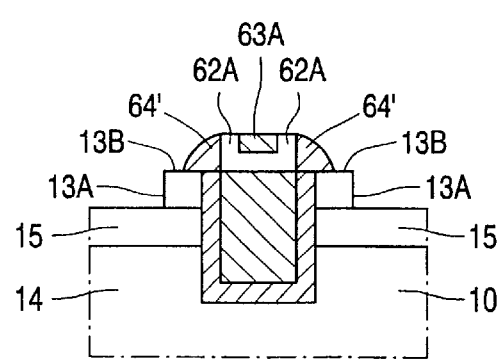

As illustrated in FIG. 1F, the silicon dioxide spacers 64 are then etched back to form reduced spacers 64', and thus to expose top surfaces 13B of the source regions 13, and then the silicon nitride upright portions 62A are etched back to form a planarised surface with the reduced height filler 63A.

Referring now to FIG. 2, two transistor cells are shown with surrounding trench-gate structures 20, 17, 11. After forming the structure shown in FIG. 1F, two and a half such structures being shown in FIG. 2, electrode material (for example aluminium) is deposited to provide the source electrode 23. The source electrode 23 extends over the reduced fillers 63A, over the reduced upright portions 62A and over the reduced spacers 64, and the source electrode 23 contacts the exposed side surface 13A and exposed top surface 13B of the annular source region 13 in each transistor cell and the channel-accommodating body region 15 within and adjacent the source region 13 in each transistor cell.

Figure 3B:
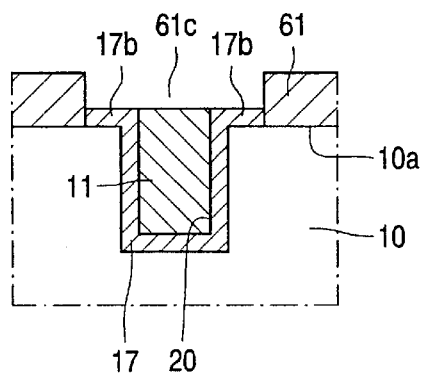
FIGS. 3B, 3C and 3E are a cross-sectional view of the semiconductor body at stages corresponding to those shown respectively in FIGS. 1B, 1C and 1E but modified in another example in accordance with the invention.
Figure 3C:
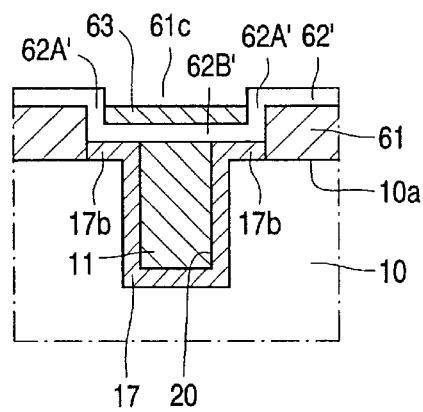
Figure 3E:
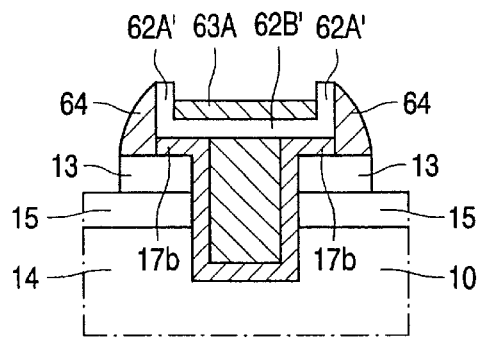

Referring now to FIGS. 3B, 3C and 3E, these Figures show the semiconductor body 10 at stages corresponding to those shown respectively in FIGS. 1B, 1C and 1E but modified as will now be described.

The trench 20 shown in FIG. 3B is formed using an etch window 61a in a silicon dioxide mask 61 as has been described with reference to FIG. 1A. The mask 61 is then etched to widen the windows 61a so that each widened window 61c as shown in FIG. 3B forms a first window in a first mask of the first material, silicon dioxide. The gate insulating layer 17 of silicon dioxide is then formed in each trench 20 and has horizontal extensions 17b on the surface 10a of the semiconductor body 10 within the widened first windows 61c. Gate material 11 is then deposited in the trench 20 on the insulating layer 17, 17b and then etched back level with the top surface of the insulating layer horizontal extensions 17b.

As illustrated in FIG. 3C a thin layer of silicon nitride 62' is deposited on top of the mask 61 and in each window 61c. A U-shaped section layer of silicon nitride is provided in each window 61c having upright portions 62A' and a base portion 62B' which provides a gate insulating overlayer on the gate material 11, the base portion 62B' extending over the gate insulating layer horizontal extensions 17b. In the same manner as has been described with reference to FIGS. 1C and 1D, a polycrystalline silicon filler 63 is provided in the U-shaped section layers 62A', 62B', and the top of the silicon nitride layer 62' and then the first silicon dioxide mask 61 are successively removed by etching. The silicon dioxide gate insulating layer horizontal extensions 17b remain when the silicon dioxide first mask 61 is removed, these horizontal extensions 17b protecting the gate insulation 17 near the top of the trenches 20 during this removal of the first mask 61.

The method then proceeds to the structure shown in FIG. 3E in the same manner as has been described above with reference to FIGS. 1D and 1E. That is, two stages of dopant implantation and diffusion provide a p-type channel-accommodating body region 15 and an upper n+ type region surrounded by the U-shaped section layers 62A', 62B' of silicon nitride on top of the gate insulating layer horizontal extensions 17b, except that in this case Hi the diffusion stages laterally extend the body regions and the n+regions under the extensions 17b to the trench-gate structures. Silicon dioxide spacers 64 are formed, each with a vertical surface aligned with an outer surface of an upright portion 62A', and source regions 13 are then formed by etching the n+regions using the spacers 64 as a mask. The spacers 64 will then be reduced to expose top surfaces of the source regions 13 shown in FIG. 3E in the same manner as has been described above with reference to FIG. 1F.

Figure 4C:
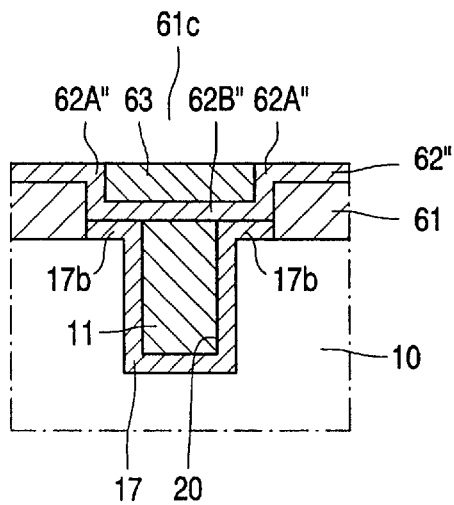
FIGS. 4C and 4E are a cross-sectional view of the semiconductor body at stages corresponding to those shown respectively in FIGS. 3C and 3E but modified in another example in accordance with the invention.
Figure 4E:
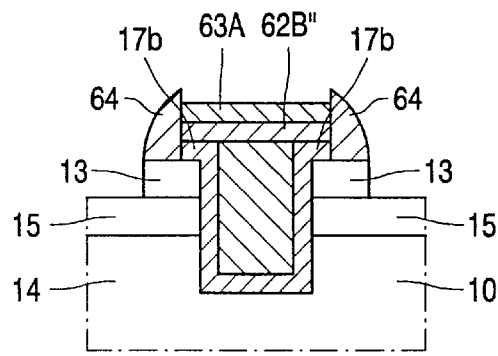

Referring now to FIGS. 4C and 4E, these Figures show the semiconductor body 10 at stages corresponding to those shown respectively in FIGS. 3C and 3E but modified as will now be described.

As illustrated in FIG. 4C, the gate insulting layer 17 of silicon dioxide is provided in each trench 20 and has horizontal extensions 17b in the same manner as shown in FIGS. 3B and 3C. However, instead of depositing a thin layer of silicon nitride 62' as shown in FIG. 3C, a thin layer of silicon dioxide 62" is deposited on top of the mask 61 and in each window 61c. Thus a U-shaped section layer of silicon dioxide is provided in each window 61c, as shown in FIG. 4C, having upright portions 62A" and a base portion 62B" which provides a gate insulating overlayer on the gate material, the base portion 62B" extending over the gate insulating layer horizontal extensions 17b. The silicon dioxide layer 62" may suitably be provided by low pressure chemical vapour deposition (LPCVD) of decomposed tetraethylorthosilicate (TEOS). A filler 63 of polycrystalline silicon, or in this case possibly silicon nitride, is provided in the U-shaped section layers 62A", 62B". In this case, a single etching stage then removes the top layer 62", the mask 61, the upright portions 62A" and part of the horizontal extensions 17b which are all of the same material, silicon dioxide.

As illustrated in FIG. 4E, the p-type body regions 15 and the upper n+ type regions are formed in the same manner as described above with reference to FIG. 3E, and then spacers 64 are formed with their vertical surface against the filler 63. Each spacer 64 vertical surface is aligned with a surface of the filler 63 at the location of an inner surface of an upright portion 62A" of the U-shaped section layer, this upright portion having been removed. Again, the spacers 64 are used as a mask to form the source regions 13 by etching as shown in FIG. 4E; and again, the spacers 64 will then be reduced to expose the top surfaces of the source regions 13.

Figure 5E:
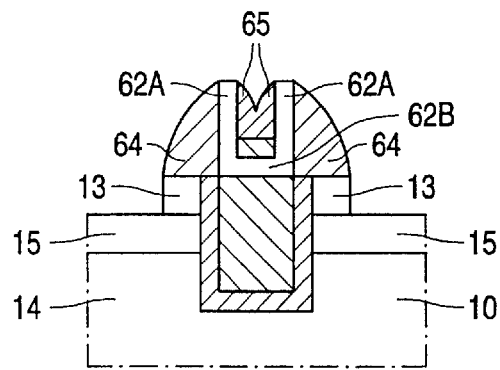
FIG. 5E is a cross-sectional view of the semiconductor body at a stage corresponding to that shown in FIG. 1E but modified in another example in accordance with the invention.

Referring now to FIG. 5E, this shows the semiconductor body 10 at a stage corresponding to that shown in FIG. 1E but modified as will now be described. A method is performed following precisely the stages as above-described with reference to FIGS. 1A to 1D. Then the filler 63 shown in FIG. 1D is removed by etching to leave the U-shaped section layers 62A, 62B with space between the upright portions 62A. A layer of deposited silicon dioxide will then have a contoured upper surface (not shown) above the silicon nitride base portion 62B, the silicon nitride upright portions 62A and the semiconductor body upper surface 10a. Anisotropic etching of this contoured silicon dioxide layer forms the spacers 64 and at the same time forms further spacers 65 against inner surfaces of the upright portions 62A as shown in FIG. 5E, and these further spacers 65 of silicon dioxide insulating material merge and cover the base portions 62B. When the spacers 64 are reduced in the manner described above with reference to FIG. 1F, the further spacers 65 shown in FIG. 5E are also reduced but leave a further insulating layer on top of the gate insulating U-cup base 62B which has the advantage of reducing gate-source capacitance in the transistor device.

Referring to FIGS. 6A to 6J, these Figures show the semiconductor body 10 at successive stages in another example of a method which, in overview, is as follows. A mask 61 of the first material, silicon dioxide, has preceding U-shaped section layers 52A, 52B, 52C of the second material, silicon nitride, provided in its windows 61a, see FIGS. 6A and 6B. A central part of the base portion 52C of each preceding layer of silicon nitride is then removed to provide an etch window 52a for a trench 20, see FIGS. 6C to 6G. The remainder of the preceding layers of silicon nitride is then removed, and the mask 61 of silicon dioxide is then used for providing the U-shaped section layers 62A, 62B which define steps for the spacers 64 used to form the source regions 13, see the stages shown in FIGS. 6H, 6I and 6J which correspond respectively but are modified with respect to the stages shown in FIGS. 3B, 3C and 3E. In this way, starting from one mask 61, a two-stage self-aligned process provides well-defined narrow trenches 20 and then well-defined source regions 13.

The successive stages of FIGS. 6A to 6J will now be described in detail.

Figure 6A:
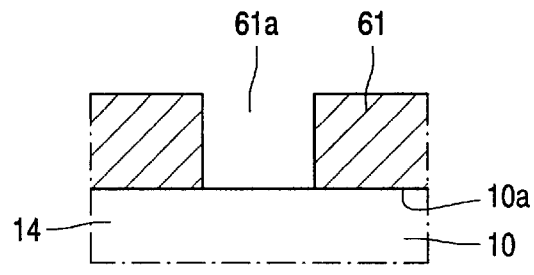
FIGS. 6A to 6J are a cross-sectional view of the semiconductor body at successive stages in another example in accordance with the invention, wherein the stages shown in FIGS. 6H, 6I and 6J correspond respectively but are modified with respect to the stages shown in FIGS. 3B, 3C and 3E.

FIG. 6A shows a monocrystalline silicon semiconductor body 10. A mask 61 of first material, silicon dioxide is formed at a surface 10a with windows 61a. The mask 61, having a typical thickness of 0.5 $\mu$m, and the window 61a, having typical width 0.6 $\mu$m, are the same as shown in FIG. 1A. Each window 61a shown in FIG. 6A has a mid-point path coincident with a mid-point path of a trench which will be formed later, but in this case the window 61a is not used as an etch window to form the trench.

Figure 6B:
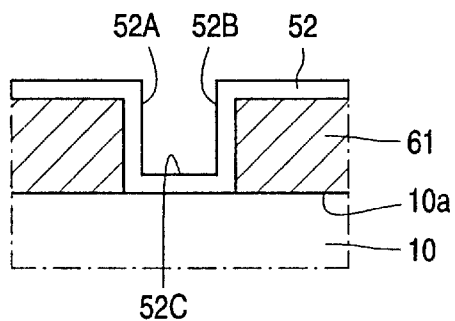

As illustrated in FIG. 6B, a continuous thin layer 52 of a second material, in this example silicon nitride, is formed by deposition on top of the first mask 61 and in each first window 61a conformal to the shape of the window 61a. The layer 52 has upright portions 52A, 52B on the sidewalls of the first mask 61 and a base portion 52C on the surface 10a of the semiconductor body 10. In the typical example, the layer 52 has a thickness of 0.05 $\mu$m.

Figure 6C:
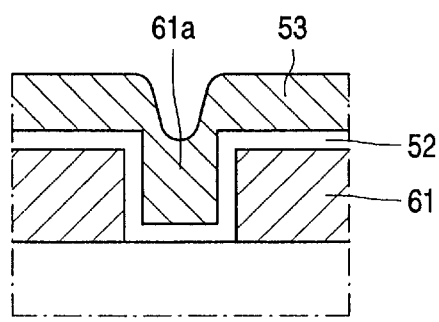
Figure 6D:
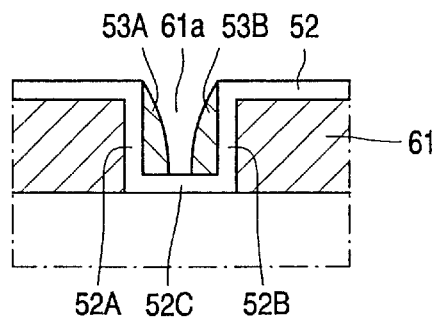

As illustrated in FIG. 6C, a layer 53 of a third material, in this example polycrystalline silicon (or amorphous, or polycrystalline silicon-germanium), is deposited on the layer 52 of silicon nitride on top of the first mask 51 and in the first windows 61a. In the typical example, the layer 53 may be 0.1 $\mu$m to 0.5 $\mu$m thick on top of the mask 61. The layer 53 has a contoured upper surface with a dip in the region of the window 61a. The layer 53 is then anisotropically etched back to expose the layer 52 of silicon nitride on top of the first mask 61 and to leave an intermediate mask of the third material in each first window 61a as two curved sidewall parts 53A, 53B as shown in FIG. 6D. The sidewall parts 53A, 53B cover the upright portions 52A, 52B of the layer of silicon nitride and cover the base portion 52C of the layer of silicon nitride except at a central part where a second window will be formed. In the typical example the sidewall parts 53A, 53B each have a width of 0.125 $\mu$m at their base and the uncovered width of the base portion 52C is 0.25 $\mu$m.

Figure 6E:
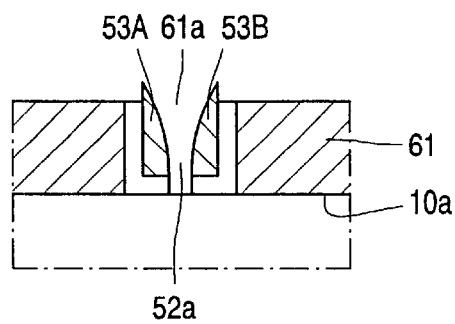
Figure 6F:
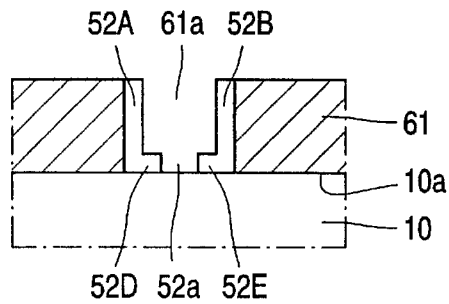

As illustrated in FIG. 6E, the intermediate mask 53A, 53B in each first window 61a, is used to etch the central part of the base portion 52C of the layer of silicon nitride and form a second window 52a. At the same time, the silicon nitride layer 52 is removed from the top of the first mask 51. As illustrated in FIG. 6F, the intermediate mask 53A, 53B is then removed by etching to leave a pair of L-shaped parts of silicon nitride within each first window 61a as two sidewall extensions to the first mask 61, each L-shaped part having an upright portion 52A, 52B and having a rectangular section base portion 52D, 52E with a top surface parallel to the semiconductor body surface 10a and a side surface perpendicular to the semiconductor body surface. The two L-shaped sidewall extensions to the first mask 61 form a second mask on the semiconductor body 10 with each second window 52a in the second mask being formed within and smaller than a first window 61a.

Figure 6G:
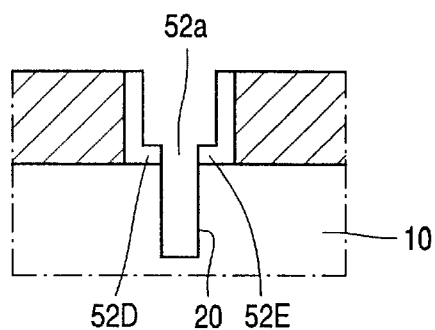

As illustrated in FIG. 6G a trench 20 is then formed by etching into the semiconductor body 10 at each second window 52a, preferably using an anisotropic plasma etch. The rectangular base portion 52D, 52E of each L-shaped silicon nitride part ensures that there is no appreciable widening of the second windows 52a during trench etching, and so the trenches 20 will be maintained narrow during etching in accordance with the second windows 52a. In the typical example the width of the trench 20 is 0.25 μm and the depth of the trench 20 is 1.0 μm.

Figure 6H:
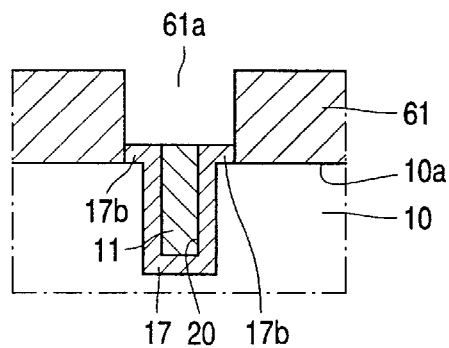

As illustrated in FIG. 6H, the remainder of the preceding U-shaped section layer 52A, 52B, 52C of silicon nitride in each window 61a, that is to say the pair of L-shaped parts 52A, 52D and 52B, 52E, is then removed by etching to leave the first window 61a in the first mask 61.

Figure 6I:
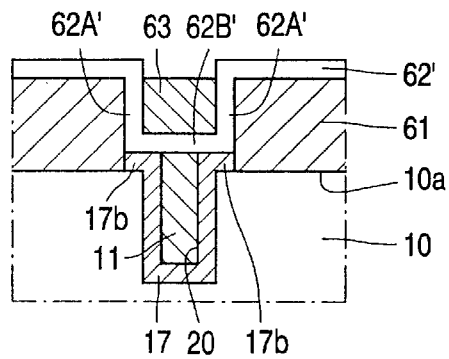
Figure 6J:
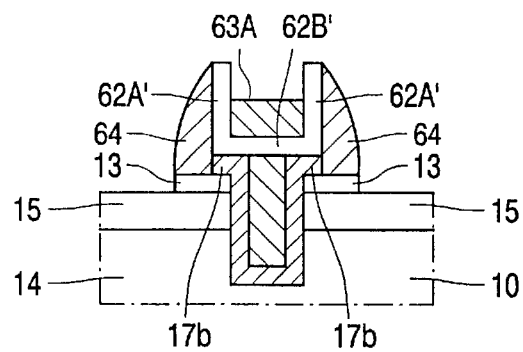

The method then proceeds with steps that are, in most respects, similar to those described above with reference to FIGS. 3B, 3C and 3E. Thus, as shown in FIG. 6H, the first window 61a in the first, silicon dioxide, mask is already wider than the trench 20, the silicon dioxide gate insulating layer 17 is formed with horizontal extensions 17b on the semiconductor body surface 10a, and gate material 11 is provided to be level with the top surface of the horizontal extensions 17b. As shown in FIG. 6I, a U-shaped section layer of silicon nitride is provided in each window 61a having upright portions 62A' and a base portion 62B', and polycrystalline silicon fillers 63 are provided. As shown in FIG. 6J, the mask 61 is removed, p-type body regions 15 and upper n+ type regions are provided, and silicon dioxide spacers 64 are formed and used as an etching mask to form the source regions 13.

Advantages for a cellular trench-gate power transistor of the method described above with reference to FIGS. 6A to 6G, which is well adapted for producing narrow trenches, are as follows.

For comparatively low voltage vertical trench-gate power transistors, where the transistor cells are adapted to withstand a specified source-drain voltage in the off-condition and where this specified voltage is in the range up to about 50 volts, the channel resistance is the predominant contribution to the specific on-resistance of the device. Where the transistor cells are configured in a two-dimensionally repetitive pattern, for example having a square cell geometry, narrowing the trench-gate width for a given transistor cell pitch significantly increases the perimeter of the channel-accommodating region i.e. increases the channel width and hence reduces the channel resistance. We have found that where the cell pitch is 2 μm, a square cell device with a trench width of 0.25 μm has a 10 percent reduced specific on-resistance compared with a device having a trench width of 0.5 μm. Furthermore, we have found that for similar devices having a cell pitch in the range 1 μm to 3 μm, trenches having a width in the range of 0.1 μm to 0.4 μm produce a reduction in specific on-resistance of up to 20% compared with devices having a trench width of 0.5 μm. The method described above is well adapted to producing trenches with this indicated range of narrow widths. We envisage an aspect ratio of 4 or more for the trenches of vertical trench-gate power transistors made in accordance with this method, which for the range of trench widths just given may correspond to trenches having a depth in the range of 0.5 μm to 3 μm. We have found that for a given transistor cell pitch, narrowing the trench-gate width reduces the gate-drain capacitance and hence reduces the RC delay time to a value which is comparable with that which would otherwise be achieved with a smaller cell pitch. Thus trench widths in the above-stated range of 0.1 μm to 0.4 μm provide, for transistor cells having a cell pitch in the above-stated range of 1 μm to 3 μm, an RC delay time which is about the same as would otherwise only be achieved by a reduction of the cell pitch to about 0.5 μm. Also for a given transistor cell size within each surrounding trench-gate structure, a narrower trench-gate allows a greater number of transistor cells to be accommodated within a given active area of the device with a consequent reduction in the specific on-resistance of the device.

Variations and modifications of the above-described power transistors and their methods of manufacture, within the scope of the present invention, include the following. In all cases where the spacers 64 are formed against the U-shaped section second layer uprights 62A, 62A', this requires the second material for the second layer, given above as silicon nitride, to be different from the first material for the first mask 61, given above as silicon dioxide. Other combinations of different first and second materials are possible, for example the second material being silicon dioxide and the first material being silicon nitride. In the case where the spacers 64 are formed against the filler 63, the first and second materials are the same, given above as silicon dioxide. In this case the first and second materials could instead both be silicon nitride, and the gate insulating layer 17, 17b could also be silicon nitride. As shown in FIG. 1A, the mask 61 is formed on the semiconductor body 10 which has the drain drift n-region 14 extending to the top surface 10a; and then as described above with reference to FIG. 1D, the p body regions 15 and then the n+ regions 13a for the source regions are provided by implantation and diffusion after forming the trench-gate structures 20, 17, 11 and the U-shaped section layers 62A, 62B with the filler 63. Another possibility is that, before forming the mask 61 at the FIG. 1A stage the semiconductor body 10 could already have a p body region 15 formed by implantation or epitaxial deposition with only the n+ region 13a being formed at the stage of FIG. 1D; and a further possibility is to provide both the p body regions 15 and the n+ regions 13a for the sources before forming the mask 61 at the FIG. 1A stage. In all the above-described examples the spacers 64 are used as a mask for etching the upper n+ regions 13a to form the source regions 13. The spacers 64 could be used differently to form the source regions. Thus, the spacers 64 could be doped material, for example. polycrystalline silicon with n-type phosphorous or arsenic dopant, and the source regions 13 could be formed by diffusing this dopant from the spacers 64 into an upper p-type body region 15. Another possibility is that the spacers 64 themselves could form the source regions 13, the spacers in this case being either doped silicon or metal.

Further variations and modifications of the above-described power transistors and their methods of manufacture, within the scope of the present invention, include the following. Instead of n-type conductivity source and drain regions separated by a p-type conductivity channel-accommodating region, the source and drain regions may be p-type with the channel-accommodating region being n-type. Instead of the channel-accommodating region being of the opposite conductivity type to the source and drain regions in the usual type of device, the channel-accommodating region may be of the same conductivity type as the source and drain regions in an accumulation-mode device in which the conductive channel induced by the trench-gate in the on-state is formed by charge-carrier accumulation. At least some of the transistor cells may have a localised region of opposite conductivity type to the source and drain regions, the localised region extending into the semiconductor body to the drain region and being separated from the trench-gate by the channel-accommodating region. In the usual type of device, the localised regions protect the cells against turning on of their in-built parasitic bipolar transistors.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

Thus, for example, as well as the invention set out in the following claims, there is also disclosed a method of manufacturing a trench-gate semiconductor device comprising a semiconductor body 10 having a plurality of transistor cells, each transistor cell being surrounded by a trench-gate 11 comprising a trench 20 extending into the semiconductor body with gate material 11 in the trench 20, and each transistor cell having source 13 and drain 14 regions which are separated by a channel-accommodating region 15 adjacent to the trench-gate 11, wherein the method includes the steps of:

(a) forming at a surface 10a of the semiconductor body 10 a first mask 61 of a first material having first windows 61a, each first window 61a having a mid-point path coincident with a mid-point path of a said trench 20 which will be formed later;

(b) forming on the semiconductor body 10 a second mask 52A, 52D and 52B, 52E having second windows 52a, each second window 52a being formed within and smaller than a said first window 61a by providing two sidewall extensions to the first mask 61 in the first window 61a; and (c) forming said trenches 20 by etching into the semiconductor body 10 at the second windows 62a;

wherein the method has the steps of:

(d) providing in each first window 61a a continuous layer of a second material 52 from which the second mask will be formed, the layer of second material having upright portions 52A, 52B on the sidewalls of the first mask 61 and a base portion 52c on the surface 10a of the semiconductor body;

(e) forming an intermediate mask 53A, 53B of a third material 53 in each first window 61a covering the upright portions 52A, 52B of the layer of second material 52 and covering the base portion 52C of the layer of second material except where the second window 52a will be formed;

(f) using the intermediate mask 53A, 53B in each first window 61a to etch the base portion 52C of said layer of second material and form said second window 52a; and (g) removing the intermediate mask 53A, 53B to leave a pair of L-shaped parts 52A, 52D and 52B, 52E of said second material 52 within each first window 61a as said two sidewall extensions to the first mask, each L-shaped part having a rectangular section base portion 52D, 52E with a top surface parallel to the semiconductor body surface 10a and a side surface perpendicular to the semiconductor body surface 10a, and then carrying out step (c) to form said trenches 20.

What is claimed is:

1. A method of manufacturing a vertical power transistor trench-gate semiconductor device having a plurality of transistor cells, each transistor cell being surrounded by a trench-gate structure comprising a trench extending into a semiconductor body with gate material in the trench and a gate insulating layer between the trench and the gate material, and each transistor cell having an annular source region adjacent an upper part of the trench-gate structure and separated from a drain region by a channel-accommodating body region adjacent the trench-gate structure, wherein the method includes forming the source regions so as to be self-aligned to the trench-gate structures, characterised in that the method includes the steps of:

(a) forming on a surface of the semiconductor body a first mask of a first material with first windows, each said first window having a mid-point path coincident with a mid-point path of the location of a said trench;

(b) providing in each first window a U-shaped section layer of an insulating second material, the layers of second material being provided after the trench-gate structures are formed, each layer of second material having upright portions on the side walls of the first window and a base portion which provides a gate insulating overlayer on the gate material of a said trench-gate structure;

(c) removing the first mask and then forming spacers, each spacer having a vertical surface which is aligned with the location of a surface of a said upright portion of the layer of second material and each spacer having a horizontal base surface;

(d) using the spacers to form the annular source regions with the lateral extent of the source regions from the trench-gate structures being determined by the lateral extent of the base surface of the spacers; and (e) providing a source electrode to contact the source regions and the body regions adjacent the source regions.

2. A method as claimed in claim 1, wherein the trenches are etched into the semiconductor body at etch windows in a mask of said first material, and wherein these etch windows are narrowed by upward extensions of the gate insulating layers which are of said first material, the narrowed etch windows forming the first windows in the first mask, wherein the first and second materials are such that removing the first mask by etching does not remove said upright portions of second material, and wherein each said spacer vertical surface is aligned with an outer surface of a said upright portion of second material.

3. A method as claimed in claim 1, wherein the trenches are etched into the semiconductor body at etch windows in a mask of said first material, wherein these etch windows are then widened to form the first windows in the first mask, wherein the gate insulating layers are then provided in the trenches and have horizontal extensions on the surface of the semiconductor body within the first windows, wherein the gate material is then provided to complete the trench-gate structures, wherein said base portions of second material extend over the gate insulating layer horizontal extensions, and wherein at least part of the gate insulating layer horizontal extensions remain when the first mask is removed.

4. A method as claimed in claim 3, wherein the first and second materials are such that removing the first mask by etching does not remove said upright portions of second material, and wherein each said spacer vertical surface is aligned with an outer surface of a said upright portion of second material.

5. A method as claimed in claim 1, wherein, before step (b), a mask of said first material is formed on the surface of the semiconductor body with windows which each have a mid-point path coincident with a mid-point path of the location of a said trench, a preceding U-shaped section layer of the second material is then provided in each window, each said preceding layer of second material having upright portions on the sidewalls of the window and a base portion on the surface of the semiconductor body, a central part of the base portion of each preceding layer of second material is then removed to provide an etch window in this base portion, the trenches are etched into the semiconductor body at these etch windows, and the remainder of the preceding layers of second material is then removed.

6. A method as claimed in claim 5, wherein, after the remainder of the preceding layers of second material is removed, the windows in the mask of first material provide said first windows in said first mask.

7. A method as claimed in claim 5, wherein the first and second materials are such that removing the first mask by etching does not remove said upright portions of second material, and wherein each said spacer vertical surface is aligned with an outer surface of a said upright portion of second material.

8. A method as claimed in claim 2, wherein in step (b) the U-shaped section layers of second material are filled with a third material, and wherein in step (c) the spacers are formed with the third material present and covering the base portions of the U-shaped section layers of second material.

9. A method as claimed in claim 2, wherein in step (b) the U-shaped section layers of second material are filled with a third material, and wherein in step (c) the third material is removed before forming the spacers of an insulating material such that, at the same time as the spacers are formed, further spacers are formed against inner surfaces of the upright portions and these further spacers of insulating material merge and cover the base portions of the U-shaped section layers of second material.

10. A method as claimed in claim 2, wherein the semiconductor body is monocrystalline silicon, the gate insulating layers are silicon dioxide, the first material is silicon dioxide, and the second material is silicon nitride.

11. A method as claimed in claim 3, wherein the U-shaped section layers of second material are filled with a third material, and wherein the first and second materials are such that removing the first mask by etching also removes the upright portions of the layers of second material so that each said spacer vertical surface is aligned with a surface of the third material at the location of an inner surface of a said upright portion of the layers of second material.

12. A method as claimed in claim 11, wherein the semiconductor body is monocrystalline silicon, the gate insulating layers are silicon dioxide, and the first and second materials are both silicon dioxide.

13. A method as claimed in claim 1, wherein regions of one conductivity type suitable for the annular source regions are present in upper parts of the semiconductor body surrounded by the U-shaped section layers of second material before forming the spacers, and wherein the annular source regions are formed by etching the regions of one conductivity type using the spacers as a mask.

14. A method as claimed in claim 13, wherein said etching to form the source regions exposes side surfaces of the source regions, and wherein the spacers are then etched to expose top surfaces of the source regions, whereby in step (e) the source electrode contacts the source region exposed side surfaces and the source region exposed top surfaces.

15. A method as claimed in claim 13, wherein the regions of one conductivity type are formed by dopant implantation and diffusion after removing the first mask.

* * * * *

UNITED STATES PATENT AND TRADEMARK OFFICE
CERTIFICATE OF CORRECTION

PATENT NO.    : 6,521,498 B2
DATED         : February 18, 2003
INVENTOR(S)   : Michael A. A. Zandt In't et al.

It is certified that error appears in the above-identified patent and that said Letters Patent is hereby corrected as shown below:

<u>Title page,</u>
Item [75], Inventors: change "Heuting" to -- Hueting --.

Signed and Sealed this

Ninth Day of September, 2003

JAMES E. ROGAN
*Director of the United States Patent and Trademark Office*